United States Patent [19]

Ohri et al.

[11] Patent Number: 5,301,143

[45] Date of Patent: Apr. 5, 1994

[54] METHOD FOR IDENTIFYING A SEMICONDUCTOR DIE USING AN IC WITH PROGRAMMABLE LINKS

[75] Inventors: Kul Ohri; Kevin Duesman, both of Boise, Id.

[73] Assignee: Micron Semiconductor, Inc., Boise, Id.

[21] Appl. No.: 999,214

[22] Filed: Dec. 31, 1992

[51] Int. Cl.$^5$ .............................................. G11C 7/00
[52] U.S. Cl. .................................... 365/96; 365/225.7
[58] Field of Search .............. 365/96, 225.7, 189.01, 365/104, 200

[56] References Cited

U.S. PATENT DOCUMENTS

| | | | |
|---|---|---|---|
| 4,064,493 | 12/1977 | Davis | 365/96 |
| 4,268,911 | 5/1981 | Bell | 365/104 |
| 4,419,747 | 12/1983 | Jordan | 365/96 |
| 5,008,729 | 4/1991 | Wills et al. | 357/51 |
| 5,058,059 | 10/1991 | Matsuo | 365/104 |
| 5,120,679 | 6/1992 | Boardman et al. | 437/195 |
| 5,134,457 | 7/1992 | Hamdy et al. | 357/51 |
| 5,140,554 | 8/1992 | Schreck | 365/225.7 |
| 5,171,715 | 12/1992 | Husher et al. | 437/195 |

Primary Examiner—Eugene R. LaRoche
Assistant Examiner—A. Zarabian
Attorney, Agent, or Firm—Stephen A. Gratton

[57] ABSTRACT

A method for identifying a semiconductor die includes a programmable integrated circuit formed on the semiconductor die. The programmable circuit includes FET transistors connected to output nodes and to programmable links such as fuses, anti-fuses or laser programmable links which are connected to ground. A gate element of each transistor is connected to an address line which controls current flow through the transistors to the output nodes. During manufacture, the programmable links can be selectively activated to create an identification code which can be read at the output nodes of the integrated circuit upon input of a predetermined address code.

19 Claims, 1 Drawing Sheet

METHOD FOR IDENTIFYING A SEMICONDUCTOR DIE USING AN IC WITH PROGRAMMABLE LINKS

FIELD OF THE INVENTION

This invention relates to semiconductor devices and more particularly to a novel method for identifying a semiconductor die using a programmable integrated circuit having programmable links such as fuses, anti-fuses or laser programmable links that can be selectively activated to create an identifying code.

BACKGROUND OF THE INVENTION

Semiconductor manufacture involves the formation of semiconductor devices on a semiconducting substrate. A large number of semiconductor devices or ICs are typically constructed on a wafer of single crystal silicon or gallium arsenide. The area on the wafer occupied by a discrete device or IC is called a die. After formation, the wafer is sawed into individual dies. Typically, each die is then packaged in a plastic or ceramic package which is recognizable as an IC chip.

Identifying data with respect to a particular die may sometimes be useful during the manufacture or life of the die. This data may include a date of manufacture, identification of a particular wafer from which a die was obtained, or identification of the location of a die on a wafer. Such information may be used for instance, to evaluate the performance characteristics of the die or IC chip.

In the past, this type of identifying data has been imprinted on the die, or on the outside of the packaged chip, using visual codes. A problem with a visual ID of a die is that a die is small and fragile and there is not much area available for an ID. In addition, after separation from a wafer, a die is subjected to many manufacturing steps that may damage and render a visual ID as unreadable. Moreover, a visual ID of a packaged chip may become unreadable during installation of the chip on a printed circuit board or during the life of the chip by an end user.

In view of the foregoing, there is need in the art for a method of identifying a semiconductor die, or other semiconductor structure, that is permanent and which is accessible during the manufacturing process and also during the subsequent life of a semiconductor chip. The present invention recognizes that a semiconductor die may be constructed with an integrated circuit that includes programmable links (i.e. fuses, anti-fuses, or programmable laser links), which may be used to create a code for identifying the semiconductor die.

Programmable links have heretofore been utilized in programmable semiconductor circuits. In general, programmable links are electrical interconnects that are either broke or created at selected electronic nodes to activate or deactivate the node. Such programmable links are widely used for instance, in programmable read only memory devices (PROMs).

The most common type of programmable link is a fuse. Fuses are typically formed of a material such as titanium tungsten alloy (TiW) formed in a bow-tie like shape (i.e. narrow neck, wide ends). If a sufficiently high voltage is applied to a fuse, the current flow will cause the fuse to heat up. This melts the neck of the fuse and causes the fuse to "blow" and create an open circuit.

PROM devices often include fuses which may connect a transistor or other electronic node to a lattice network. The PROM may be programmed by blowing the fuse to a selected node and creating an open circuit. A combination of blown and unblown fuses may thus represent a digital pattern of ones and zeros signifying data which a user wishes to store in the PROM.

Another type of programmable link used in programmable semiconductor circuits is called an anti-fuse. Anti-fuses, instead of causing an open circuit, create a short circuit or low resistance link. Anti-fuses typically include a pair of conductors having some type of dielectric or insulating material between them. The application of a predetermined voltage to the anti-fuse will break down the dielectric material and electrically connect the conductors together. An anti-fuse may also be enabled by directing a laser beam at a predetermined portion of the anti-fuse (i.e. the dielectric) to electrically connect the conductors together.

Still another type of programmable link is known as a laser programmable link. As an example, a segment of a conductive line (i.e. polysilicon) located on the surface of a chip can be melted through at a predetermined location using a laser beam. This is also sometimes referred to as laser break-link programming.

In accordance with the present invention, a semiconductor die can be constructed with programmable links arranged in a circuit for identifying the die. Such a circuit is permanent and electronically accessible.

Accordingly, it is an object of the present invention to provide a method for identifying a semiconductor die utilizing a programmable integrated circuit which can be easily accessed during manufacture and throughout the life of a semiconductor die. It is a further object of the present invention to provide an integrated circuit which includes programmable links that may be selectively activated to create a code for identifying a semiconductor die. It is yet another object of the present invention to provide a programmable integrated circuit for identifying a semiconductor die that is adaptable to large scale semiconductor manufacture.

SUMMARY OF THE INVENTION

In accordance with the present invention, a method for identifying a semiconductor die is provided. The method of the invention utilizes a programmable integrated circuit formed on the semiconductor die. The programmable integrated circuit includes a matrix of row lines and column lines. Each row line is accessible through a row address upon initiation of a test mode key. Each column line includes a pair of FET transistors connected in series to an output node and to a programmable link connected to ground. The gate element of each FET transistor is connected to a row line and to a specific row address.

During manufacture, the programmable links may be selectively activated to create an identification code responsive to a predetermined address code. In an illustrative embodiment, the programmable links may be fuses which may be selectively blown to create an identification code for the die. In an alternate embodiment, anti-fuses may be utilized in place of fuses within the integrated circuit and selectively enabled to create the identification code. The anti-fuses may be either voltage or laser programmable. In yet another alternate embodiment, a laser programmable link located at a desired location of the integrated circuit may be melted to create the identification code.

In accordance with the method of the invention, the gate elements of each transistor can be addressed to control current flow through a particular column line and to an output node of the column line. Depending on the address code and the condition of the programmable link for that column line, an identification code can be read at the output node which identifies the semiconductor die.

Other objects advantages and capabilities of the present invention will become more apparent as the description proceeds.

DESCRIPTION OF THE PREFERRED EMBODIMENT

Figure 1:
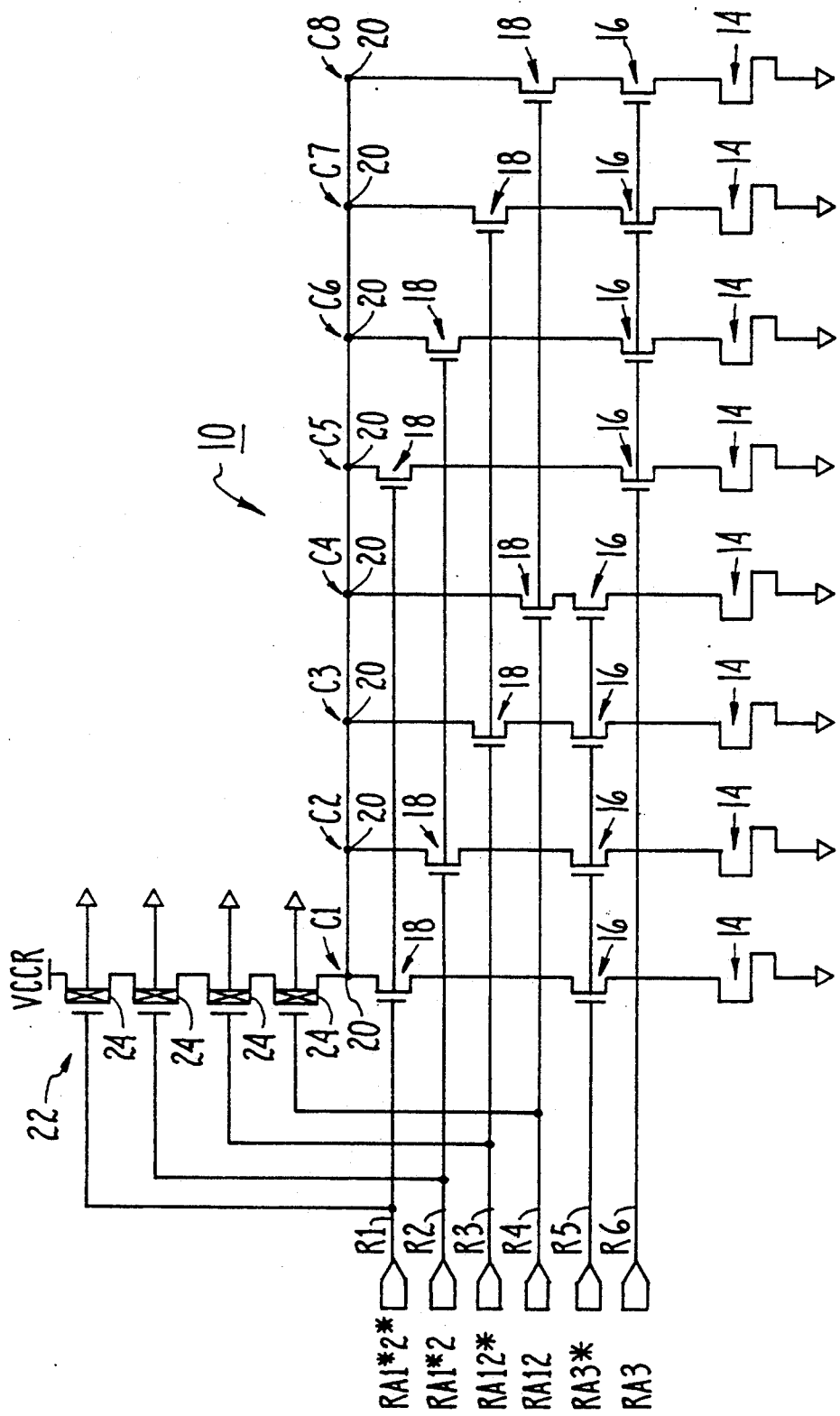
FIG. 1 is an electrical schematic of an integrated circuit constructed in accordance with the invention for identifying a semiconductor die.

The method of the invention, simply stated, uses a programmable integrated circuit in combination with a predetermined address code to create an identification code for identifying a semiconductor die. The programmable integrated circuit includes an arrangement of programmable links that may be selectively activated to program the circuit.

Referring now to FIG. 1, a programmable integrated circuit useful for identifying a semiconductor die or other semiconductor structure in accordance with the method of the invention is shown and designated as 10. The integrated circuit 10 is formed on the semiconductor die at the time of manufacture.

The programmable integrated circuit 10 is arranged in a matrix (or lattice) of row lines R and column lines C. In the illustrative embodiment, there are six row lines R1-R6 and eight column lines C1-C8. This arrangement, however, is merely exemplary and a lesser or greater number of row lines R1-R6 and column lines C1-C8 may be utilized. The row lines R1-R6 are coupled to a row decoder (not shown) which addresses the individual row lines through row addresses, RA1*2*, RA1*2, RA12*, RA12, RA3*, RA3. Access to the row addresses RA1*2*, RA1*2, RA12*, RA12, RA3*, RA3, may be gained by initiating a test mode key as is known in the art.

The programmable integrated circuit 10 also includes eight programmable links 14 located in each column line C1-C8. Each programmable link 14 is connected to ground. The programmable links 14 may be formed as fuses, anti-fuses or as laser programmable links (i.e. conductive lines having programmable areas responsive to a laser beam). Each of these types of programmable link 14 can be constructed by techniques that are known in the art.

Each programmable link 14 is electrically connected in series to a pair of semiconductor transistors 16, 18. The transistors 16, 18 in turn are connected to a conductive line which is connected to a Vcc voltage source. Each column line C1-C8 terminates in an output node 20.

The transistors 16, 18 are preferably metal-oxide-semiconductor field-effect transistors (MOSFETs) of either the enhancement or depletion load type. The programmable links 14 are connected to the drain elements of transistors 16. The source elements of transistors 16 in turn are connected to the drain elements of transistors 18. Finally, the drain elements of transistors 18 are connected to an output node 20.

The gate element of each transistor 18, 20 is connected to a row line R1-R6. Row line R1 connects to the gate element of transistors 18 for column lines C1 and C5. Row line R2 connects to the gate element of transistors 18 for column lines C2 and C6. Row line R3 connects to the gate element of transistors 18 for column lines C3 and C7. Row line R4 connects to the gate element of transistors 18 for column lines C4 and C8. Row line R5 connects to the gate element of transistors 16 for column lines C1-C4. Row line R6 connects to the gate element of transistors 16 for column lines C5-C8.

Row lines R1-R4 for the transistors 18 are connected to a precharge circuit 22. As an example, the precharge circuit 22 may function as a P-channel precharge. The precharge circuit 22 includes an arrangement of precharge transistors 24 connected in series to a voltage source Vccr. The gate element of each precharge transistor 24 is connected to a row line R1-R4 respectively for precharging or clocking the transistors 18 associated with a particular row line R1-R4. Precharging allows the power dissipation for the gates of transistors 18 to be determined by a duty cycle and clock rate. The output of these transistors 18 may thus be precharged to a "1" logic level.

The programmable circuit 10 is programmed by selectively activating a programmable link 14 to create an identification code responsive to a predetermined address code. The identification code identifies the semiconductor die on which the circuit 10 is formed. The programmable links 14 are thus activated at the time of manufacture of the semiconductor die. Fuse programmable links 14 are activated by blowing the fuse. Anti-fuse programmable links are activated by enabling the anti-fuse. An anti-fuse may be either voltage activated or laser activated. Laser programmable links are activated by melting a programming area of a conductive line.

With this arrangement, for a given address code which is inputted into row lines R1-R6, and based on the condition of the programmable links 14, a predetermined output can be read at the output nodes 20. A digital pattern of ones and zeros can thus be created as an identification code. As an example, assume that programmable link 14 for column line C1 is a fuse which has been blown. A voltage input representative of a logic input "1" into row addresses RA1*2* for row line R1 and RA3* for row line R5 will produce a logic output of "1" at the output node 20 for column C1. If, however, the programmable link 14 for column line C1 has not been blown, the column line C1 will be connected to ground and the logic output at the output node 20 for column line C1 will always be "0".

Depending on the condition of the programmable links 14 and on a predetermined address combination, a given output can be achieved and read. Typically, for a given code only one programmable link 14 will be operative. With this arrangement output codes can be formulated that may identify a semiconductor die in some manner. The code may be representative of the date of manufacture of a wafer, a wafer ID, a die location ID or any other information needed for a specific die.

In the illustrative embodiment, the integrated circuit 10 includes eight column lines C1-C8 and eight programmable links 14. This arrangement will yield 64 bits of information. Alternately a greater or lesser number of column lines and programmable links may be utilized. In the simplest case two programmable links and two column lines would yield four bits of information.

Four programmable links and four column lines would yield sixteen bits of information.

In the illustrative embodiment, each column line C1-C8 includes a pair of transistors 16, 18 so that there are two separate address inputs for each output node 20. Alternately, a lesser number of transistors (i.e. 1) or a greater number of transistors may be utilized to create different logic combinations.

Thus, the invention provides a method for electrically identifying a semiconductor die utilizing a programmable circuit and a predetermined address code. The method of the invention for identifying a semiconductor die may include the following steps:

1. Forming a programmable circuit on the semiconductor die using programmable links.
2. Selectively activating the programmable links at the time of manufacture to create an identification code responsive to a predetermined address code.
3. Addressing the programmable circuit with a test mode key.
4. Inputting a predetermined address code into the programmable circuit.
5. Reading an identification code at the output nodes of the programmable circuit.

Although the method of the invention has been described in connection with a particular programmable circuit, it is to be understood that a variety of other circuit arrangements are possible. Thus it is intended that alternate embodiments of the inventive concepts expressed herein be included within the scope of the following claims.

What is claimed is:

1. A method for identifying a semiconductor die comprising;
    forming a programmable integrated circuit on the die including programmable links connected to output nodes and to an FET transistor;
    selectively activating the programmable links;
    addressing the FET transistor with a predetermined address code to control current flow to each output node such that for a given address code and based on a condition of the programmable links a predetermined identification code can be read at the output nodes; and then
    reading the predetermined identification code at the output nodes to identify the semiconductor die.

2. The method for identifying a semiconductor die as recited in claim 1 and wherein the programmable links are selected from a group consisting of fuses, anti-fuses or laser programmable links.

3. The method for identifying a semiconductor die as recited in claim 2 and wherein each programmable link is connected to a pair of FET transistors and a gate element of each transistor is addressable by the address code to control current flow to the output nodes.

4. The method for identifying a semiconductor die as recited in claim 1 and further comprising precharging the FET transistor using a precharge circuit.

5. A method for identifying a semiconductor die comprising:
    forming a programmable integrated circuit on the semiconductor die including at least two output nodes with each output node connected to a programmable link and to an FET transistor and with each transistor having a gate element addressable with a predetermined address input to control a current flow to the output nodes;
    selectively activating the programmable links of the integrated circuit;
    addressing the gate elements of the transistors with a predetermined address code such that for a given address code and based on a condition of the programmable links a predeterminal identification code can be read at the output nodes; and
    reading an output signal at the output nodes representative of the identification code.

6. The method for identifying a semiconductor die as recited in claim 5 and wherein the programmable links are selected from a group consisting of fuses, anti-fuses or laser programmable links.

7. The method for identifying a semiconductor die as recited in claim 6 and wherein the programmable links are connected to ground.

8. The method for identifying a semiconductor die as recited in claim 7 and wherein the programmable integrated circuit is a matrix arrangement of rows and columns.

9. The method for identifying a semiconductor die as recited in claim 8 and wherein the transistor and programmable links are arranged in column lines and the gate elements of the transistor are addressable through address lines.

10. The method for identifying a semiconductor die as recited in claim 9 and wherein a pair of transistors are connected in series in each column line so that each output node is controlled by two address inputs.

11. The method for identifying a semiconductor die as recited in claim 10 and wherein some of the transistors are precharged.

12. The method for identifying a semiconductor die as claimed in claim 11 and wherein a P-channel of the transistors are precharged.

13. The method of identifying a semiconductor structure as claimed in claim 12 and wherein the identification code identifies a wafer from which the semiconductor die was obtained.

14. A programmable integrated circuit for identifying a semiconductor die, said circuit formed on the die and comprising:
    first and second pairs of FET transistors, each pair of FET transistors connected to an output node of a conductive line having multiple output nodes;
    an address line connected to a gate element of each transistor for controlling current flow through each pair of FET transistors to the output nodes; and
    first and second programmable links connected to the first and second pairs of transistors respectively and to ground with the programmable links adapted to be selectively activated to create an identification code readable at the output nodes upon input of a predetermined address code to the address lines such that for a given address code and based on a condition of the programmable links a predetermined identification code can be read at the output nodes to identify the die.

15. The integrated circuit as claimed in claim 14 and wherein the programmable links are selected from a group consisting of fuses, voltage programmable anti-fuses, laser programmable anti-fuses, or laser programmable links.

16. The integrated circuit as claimed in claim 15 and wherein some of the FET transistors are precharged.

17. The integrated circuit as claimed in claim 16 and wherein the address lines are arranged in rows and the FET transistors and programmable elements are arranged in columns.

18. The integrated circuit as claimed in claim 17 and wherein there are eight programmable links to provide sixty-four bits of information.

19. The integrated circuit as claimed in claim 18 and wherein the semiconductor structure is a semiconductor die.

* * * * *